United States Patent
Clark

(10) Patent No.: US 12,532,719 B2
(45) Date of Patent: Jan. 20, 2026

(54) BARRIER SCHEMES FOR METALLIZATION USING MANGANESE AND GRAPHENE

(71) Applicant: Tokyo Electron Limited, Tokyo (JP)

(72) Inventor: Robert D. Clark, Fremont, CA (US)

(73) Assignee: TOKYO ELECTRON LIMITED, Tokyo (JP)

( * ) Notice: Subject to any disclaimer, the term of this patent is extended or adjusted under 35 U.S.C. 154(b) by 595 days.

(21) Appl. No.: 17/864,143

(22) Filed: Jul. 13, 2022

(65) Prior Publication Data

US 2023/0045140 A1 Feb. 9, 2023

Related U.S. Application Data

(60) Provisional application No. 63/229,925, filed on Aug. 5, 2021.

(51) Int. Cl.
*H01L 21/768* (2006.01)
*H01L 23/532* (2006.01)

(52) U.S. Cl.
CPC .. *H01L 21/76867* (2013.01); *H01L 21/76828* (2013.01); *H01L 21/76834* (2013.01); *H01L 21/7685* (2013.01); *H01L 21/76852* (2013.01); *H01L 21/76868* (2013.01); *H01L 21/76885* (2013.01); *H01L 23/53233* (2013.01); *H01L 23/53238* (2013.01); *H01L 21/76865* (2013.01); *H01L 21/76873* (2013.01); *H01L 21/76879* (2013.01)

(58) Field of Classification Search
CPC ........... H01L 21/7685; H01L 21/76852; H01L 23/53233; H01L 21/76868
See application file for complete search history.

(56) References Cited

U.S. PATENT DOCUMENTS

| | | | |
|---|---|---|---|
| 6,869,878 B1 | 3/2005 | Adem et al. | |
| 8,035,230 B2* | 10/2011 | Arakawa | H01L 21/76864 257/734 |
| 8,492,897 B2* | 7/2013 | Cabral, Jr. | H01L 21/76873 257/751 |
| 9,000,594 B2 | 4/2015 | Ott et al. | |
| 9,412,654 B1 | 8/2016 | Bao et al. | |
| 9,754,891 B2* | 9/2017 | Briggs | H01L 23/5329 |
| 9,786,760 B1* | 10/2017 | Bonilla | H01L 21/76831 |
| 2007/0004190 A1 | 1/2007 | Dambrauskas et al. | |
| 2008/0142974 A1 | 6/2008 | Arakawa | |

(Continued)

FOREIGN PATENT DOCUMENTS

KR 20090052517 A 5/2009

OTHER PUBLICATIONS

PCT International Search Report and Written Opinion, PCT/US2022/037314; dated Nov. 7, 2022, 13 pages.

(Continued)

*Primary Examiner* — Daniel Luke
(74) *Attorney, Agent, or Firm* — Slater Matsil, LLP

(57) ABSTRACT

A method of forming a semiconductor device includes providing a substrate having a patterned film including manganese; depositing a graphene layer over exposed surfaces of the patterned film; depositing a dielectric layer containing silicon and oxygen over the graphene layer; and heat-treating the substrate to form a manganese-containing diffusion barrier region between the graphene layer and the dielectric layer.

20 Claims, 17 Drawing Sheets

(56) References Cited

U.S. PATENT DOCUMENTS

| | | |
|---|---|---|
| 2014/0127896 A1 | 5/2014 | Bonilla et al. |
| 2019/0189744 A1 | 6/2019 | Kim et al. |
| 2019/0221477 A1 | 7/2019 | Amanapu et al. |
| 2020/0303251 A1 | 9/2020 | Wada et al. |

OTHER PUBLICATIONS

Korean Office Action Translation, Patent Application No. 10-2024-7006377, dated Aug. 14, 2025, 18 pages.

* cited by examiner

BARRIER SCHEMES FOR METALLIZATION USING MANGANESE AND GRAPHENE

CROSS-REFERENCE TO RELATED APPLICATIONS

This application claims the benefit of U.S. Provisional Application No. 63/229,925, filed on Aug. 5, 2021, which application is hereby incorporated herein by reference.

TECHNICAL FIELD

The present invention relates generally to semiconductor device fabrication, and more particularly, to barrier schemes for metallization using manganese and graphene.

BACKGROUND

A barrier layer is required between copper interconnect leads and the surrounding dielectric layer for reliability. Copper diffusion and electromigration degrades the dielectric resulting in a reduced breakdown voltage and in some cases an electrical short between adjacent interconnect leads.

Minimizing barrier thickness surrounding scaled copper (Cu) interconnects to reduce resistance is critical for future microelectronic devices. Conventional barrier materials such as titanium nitride and tantalum nitride do not thin proportionally as copper interconnect leads scale. Because the resistance of conventional barrier materials is greater than the resistance of copper, Cu barrier layers contribute more and more resistance to copper interconnect leads as the leads scale. Ultra-thin barriers are difficult to engineer because any defect in the barrier provides a path for copper diffusion into the dielectric that can lead to device failure. Large Cu grain size reduces copper interconnect resistivity and is important to achieve improved electrical conductivity.

SUMMARY

A method of forming a semiconductor device includes providing a substrate having a patterned film including manganese; depositing a graphene layer over exposed surfaces of the patterned film; depositing a dielectric layer containing silicon and oxygen over the graphene layer; and heat-treating the substrate to form a manganese-containing diffusion barrier region between the graphene layer and the dielectric layer.

A method of forming a semiconductor device includes providing a substrate containing a metallization layer and a first dielectric layer containing silicon and oxygen; depositing a barrier layer over the metallization layer and over the first dielectric layer; depositing a conductive film containing manganese over the barrier layer; heat-treating the substrate for a first time to form a first manganese-containing diffusion barrier region between the barrier layer and the first dielectric layer; patterning and etching the conductive film to form a patterned conductive film over the first manganese-containing diffusion barrier region; depositing a graphene layer over a sidewall surface and on a top surface of the conductive film; depositing a second dielectric layer containing silicon and oxygen on the graphene layer; and heat-treating the substrate for a second time to form a second manganese-containing diffusion barrier region.

A semiconductor device includes substrate containing a patterned copper film containing manganese; a graphene layer disposed over exposed surfaces of the patterned copper film; a first manganese-containing diffusion barrier layer disposed over portions of the graphene layer; and a first dielectric layer containing silicon and oxygen disposed over the first manganese-containing diffusion barrier layer and over the graphene layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
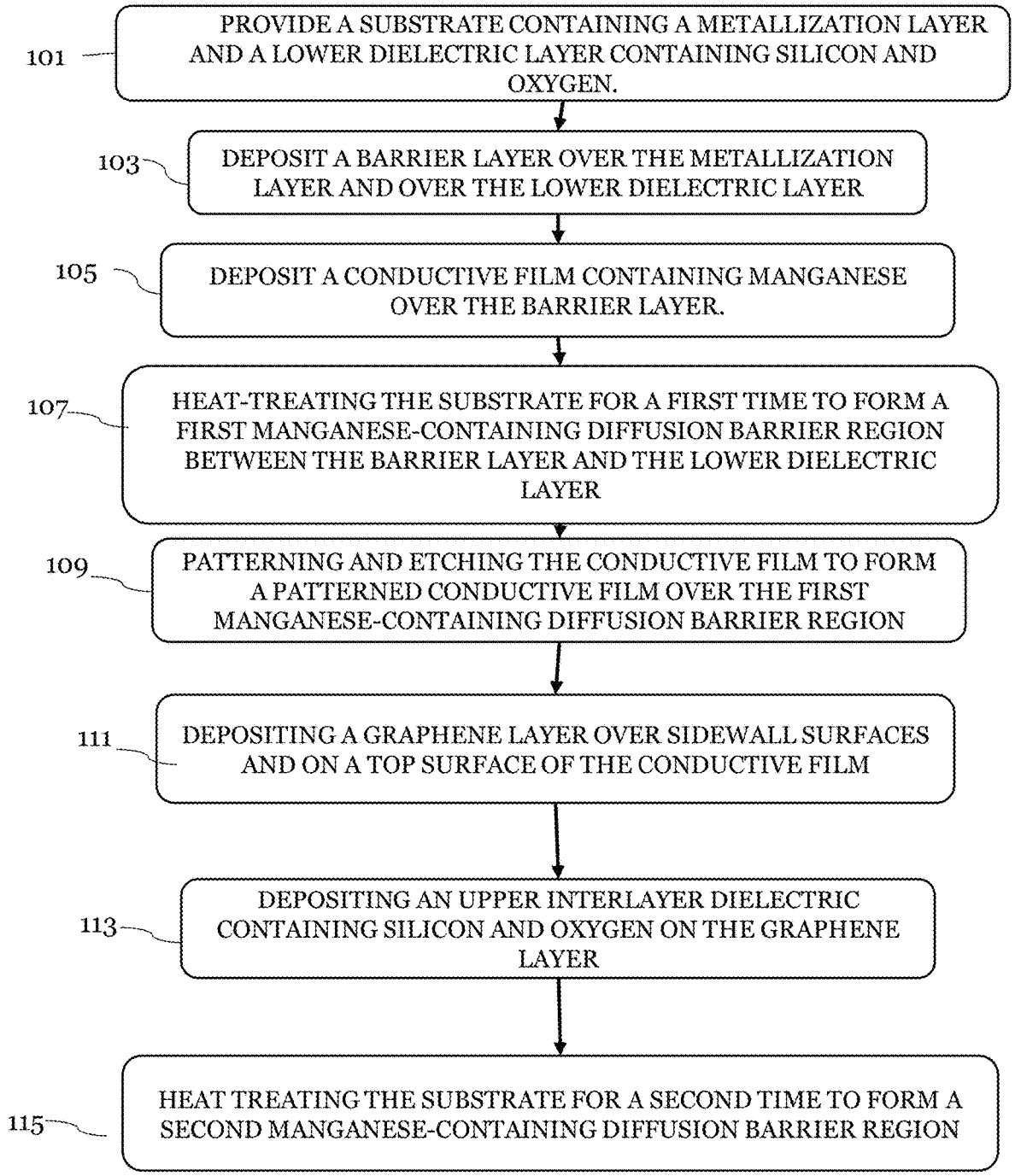
FIG. 1A is a flow diagram describing the formation of a selective copper barrier scheme on plasma etched copper interconnect using manganese and graphene and describing fabrication of a semiconductor device in accordance with embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Copper interconnect leads are enclosed with a copper diffusion barrier to prevent copper atoms from diffusing into the interlayer dielectric between interconnect leads. For example, copper diffusion may be enhanced by electric fields during operation of the IC, e.g., due to electromigration. Copper diffusion into the interlayer dielectric can reduce the breakdown voltage between the leads and in extreme cases can cause an electrical short between adjacent leads.

Barrier layers of materials such as titanium nitride (TiN) and tantalum nitride (TaN) have been used for several generations of copper interconnect. A minimum thickness of these barrier materials is required to prevent copper electromigration. As the copper interconnect leads scale, the barrier material occupies a larger cross-sectional area of the lead driving up resistance of the lead. The resistivity of TiN and TaN (~200 $\mu\Omega$cm) is about two orders of magnitude higher than the resistivity of copper (~1.7 $\mu\Omega$cm).

Embodiments of the present application replace deposited TiN or TaN barriers with a selective Cu barrier scheme using manganese (Mn) and graphene. Extremely thin graphene layers are a good barrier to Cu diffusion. In addition, graphene is highly conductive and the interface between Cu and graphene results in lower carrier scattering than the interface between Cu and TiN or TaN providing low resistance. Graphene barrier layers that effectively block Cu diffusion can be selectively grown to approximately monolayer thickness on exposed Cu metal surfaces. However, defects (e.g., grain boundaries) can form in the thin graphene barrier layer through which copper can diffuse. When Mn doped copper interconnect leads clad with a graphene barrier are annealed, Mn may diffuse from the interconnect lead through the defects and grain boundaries in the graphene barrier layer to the Cu interconnect/interlayer dielectric interface. Mn may react with silicon and oxygen in the interlayer dielectric to self-form a MnSiO barrier layer that blocks Cu diffusion through the defects. The MnSiO barrier layer forms before Cu has a chance to diffuse through the defects and into the surrounding dielectric.

The interface between the graphene barrier and the copper interconnect lead is much smoother than the interface between copper interconnect leads and traditional barrier schemes such as Ta/TaN. The atomically smooth graphene interface reduces carrier scattering, thus improving carrier mobility and thereby additionally lowering interconnect lead resistance.

FIG. 1A is a flow diagram describing formation of a copper barrier on plasma etched copper using Mn and graphene and describing fabrication of a semiconductor device in accordance with embodiments.

FIGS. 1B-1J schematically show through cross-sectional views a method for forming a device according to an embodiment of the invention.

Figure 1B:
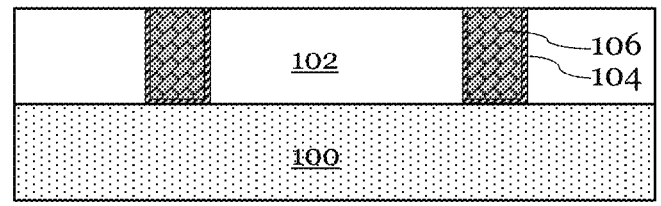
FIGS. 1B-1J are cross sectional views of a semiconductor device during various stages of fabrication in various embodiments and depicting steps in the flow diagram of FIG. 1A.

Referring to block 101 in FIG. 1A and cross-sectional view in FIG. 1B, a partially processed semiconductor device is provided. The partially processed semiconductor device comprises a semiconductor substrate 100 containing a first dielectric layer (ILD1) 102 with metal-filled features 106 extending through the first dielectric layer ILD1 102 and stopping on the substrate 100.

The film structure in FIG. 1B may be planarized to form the first dielectric layer ILD1 102 and the metal-filled features 106 in the same horizontal plane. In one or more embodiments, the metal-filled features 106 are vias. In one example, the metal-filled features 106 may contain copper metal. In another example, the metal-filled features 106 may contain tungsten metal. In another example, the metal filled vias may at least partially contain cobalt (Co) metal, Ru, Mo, Ir, Mn, Ta, Ni or silicides such as cobalt, titanium, nickel silicides.

A barrier layer 104 separates the metal-filled features 106 from the first dielectric layer ILD1 102. The semiconductor substrate 100 may be a single crystal material such as single crystal silicon, silicon-on-insulator, single crystal germanium, single crystal silicon carbide, or single crystal gallium arsenide as well other compound semiconductor substrates.

The substrate 100 may also include one or more epitaxial layers including hetero-epitaxial layers, e.g., gallium nitride on silicon. The substrate 100 under the first dielectric layer ILD1 102 may contain electrical devices such as CMOS and bipolar transistors, capacitors, resistors, inductors, and memory cells. The first dielectric layer ILD1 102 may be a silicon and oxygen containing dielectric such as silicon dioxide (SiO2) or silicon oxynitride (SiON) as well as other low-k dielectrics. In various embodiments, the first dielectric layer ILD1 102 may comprise a dielectric material such as oxide, oxynitride, and other low-k materials such as fluorine-doped silicon dioxide, organosilicate glass including carbon doped oxides, porous materials including porous silicon dioxide, porous organosilicate glass, and other spin-on dielectrics. The first dielectric layer ILD1 102 may also include air gaps in some embodiments. The first dielectric layer ILD1 102 may be deposited using thermal processes, chemical vapor deposition (CVD) processes such as CVD, low pressure CVD (LPCVD), atmospheric pressure CVD (APCVD), sub-atmospheric pressure CVD (SACVD), plasma enhanced CVD (PECVD), and spin-on processes in various embodiments.

The barrier 104 may be a barrier material such as titanium, titanium nitride, tantalum, tantalum nitride, titanium tungsten, tungsten nitride, and combinations thereof. The metal-filled features 106 may be filled with a metal such as copper, tungsten, ruthenium, iridium, or cobalt. The barrier 104 may be deposited using vapor deposition processes such as sputtering, ion metal plasma (IMP) deposition, CVD, ALD, PECVD, and others.

Figure 1C:
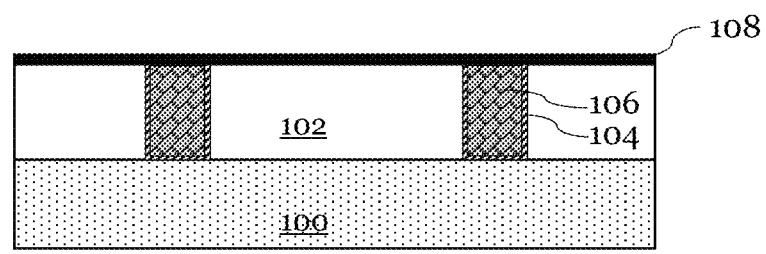

In block 103 of FIG. 1A and the cross-sectional view in FIG. 1C, barrier layer 108 is deposited over the first dielectric layer ILD1 102 and over the metal-filled features 106. In an embodiment, the barrier layer 108 is deposited as a blanket layer. In one example, the barrier layer 108 may contain Ta, TaN, Ti, or TiN. In one example, the barrier layer 108 further includes manganese (Mn), nitrides such as MnN, and oxides such as MnO. The barrier layer 108 comprises manganese (Mn) metal in one embodiment. The barrier layer 108 may be deposited using a physical vapor deposition (PVD) including sputtering, a chemical vapor deposition (CVD) method including plasma enhanced CVD (PECVD), atomic layer deposition (ALD), and others.

Figure 1D:
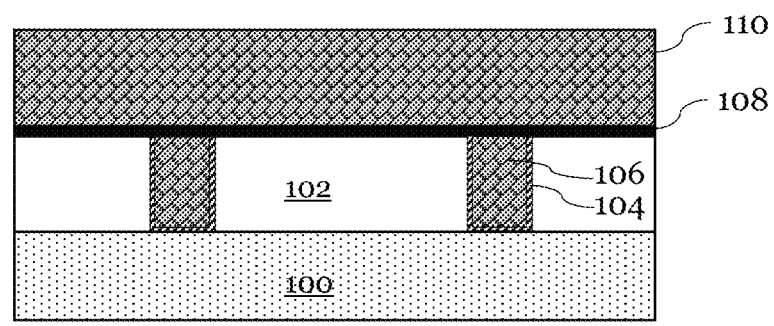

In block 105 of FIG. 1A and cross-sectional view in FIG. 1D, a copper (Cu) film 110 containing Mn is deposited on the barrier layer 108. The Cu film 110 may be deposited by chemical vapor deposition (CVD), ALD, physical vapor deposition (PVD), or electrochemical deposition in various embodiments. In various embodiments, the Cu film 110 comprises a copper alloy. In one or more embodiments, the Cu film 110 may contain between 1% and 5% atomic percent Mn. The Cu film 110 may also contain other elements such as aluminum and silicon.

Figure 1E:
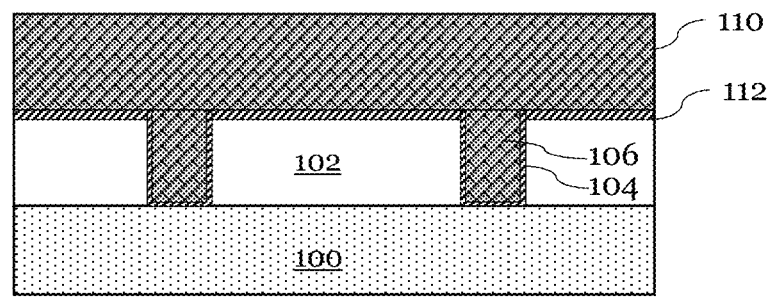

FIG. 1E and block 107 in FIG. 1A, illustrates the film structure following a first heat-treatment. A first heat-treatment comprises annealing the substrate 100 in a batch furnace or in a single wafer annealing tool. In various embodiments, the annealing may be furnace annealing, rapid thermal annealing, flash annealing, and others. During the first heat-treatment, the substrate 100 is loaded into the annealing chamber and heated to a temperature between 200° C. and 500° C. In one embodiment, the annealing may be performed between 300° C. and 400° C. In various embodiments, the substrate 100 may be annealed for a time duration of 60 s to 3600 s.

While not being limited to any specific theory, inventors of this application believe that, during the annealing, Mn thermally diffuses out of the Cu film 110 and/or from the barrier layer 108 to the surface of the first dielectric layer ILD1 102. The heat-treating causes a self-forming MnSiO barrier layer 112 to form between the Cu film 110 and the first dielectric layer ILD1 102, or on any surface containing silicon and oxygen that is in direct contact with the barrier layer 108.

According to one embodiment, heat-treating for the first time dissolves the barrier layer 112 between the metallization layer, such as is in the metal-filled features 106, and the copper film 110 providing a low electrical resistance contact. In one embodiment, the barrier layer 112 is completely dissolved during the heat-treatment. According to one embodiment, the heat-treatment is optimized to grow the grains in the Cu film 110 to as large as possible to lower the overall electrical resistivity.

Figure 1F:
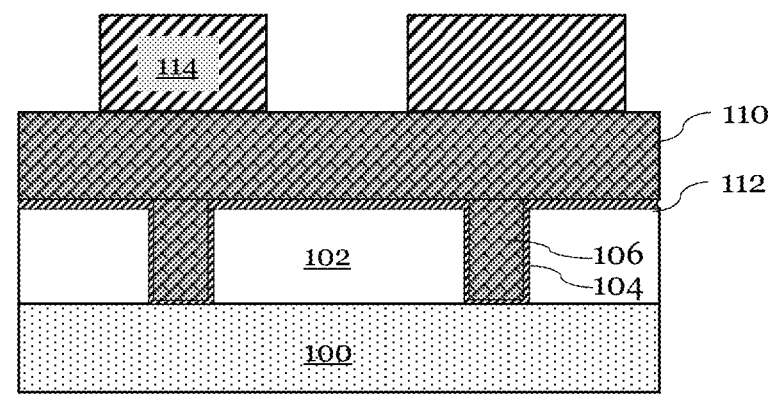

Referring to block 109 and the cross-section in FIG. 1F an interconnect lead photoresist pattern 114 is formed on the Cu film 110. The interconnect lead photoresist pattern 114 may be formed using conventional lithography in some embodiments. In other embodiments, other techniques including direct printing may be used to form the interconnect lead photoresist pattern 114. In one or more embodiments, the interconnect lead photoresist pattern 114 may include a stack of layers including an antireflective layer and a hard mask layer such as silicon nitride, titanium nitride, tungsten silicide, tungsten carbide, or ruthenium.

Figure 1G:
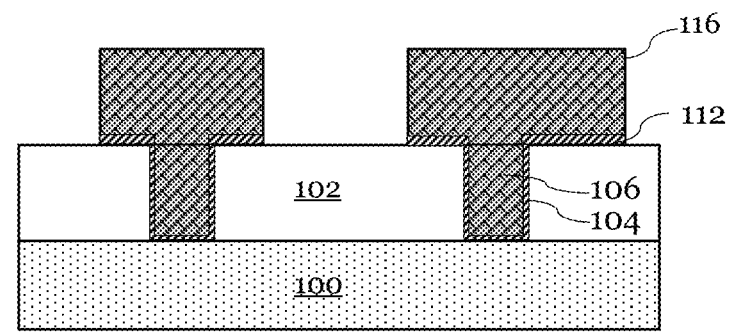

Further processing includes patterning the Cu film 110 as described in block 109 of FIG. 1A and the cross-section in FIG. 1G to form a patterned conductive film comprising copper interconnect leads 116. The Cu film 110 may be patterned using the interconnect lead photoresist pattern 114 as an etch mask and performing a plasma etching process. The plasma etching process may be performed using, for example, an etch chemistry comprising hydrogen, HBr, chlorine based chemistries with plasma hydrogen, HCl and/or chlorine including $Cl_2$/Ar.

The plasma etching process may also remove the barrier layer 112 from the first dielectric layer ILD1 102 in the openings in the patterned Cu film 110. In some embodiments, the plasma etching process may be designed to stop at the barrier layer 112 and the gas chemistry is modified once the barrier layer 112 is exposed so as to etch the exposed barrier layer 112.

Figure 1H:
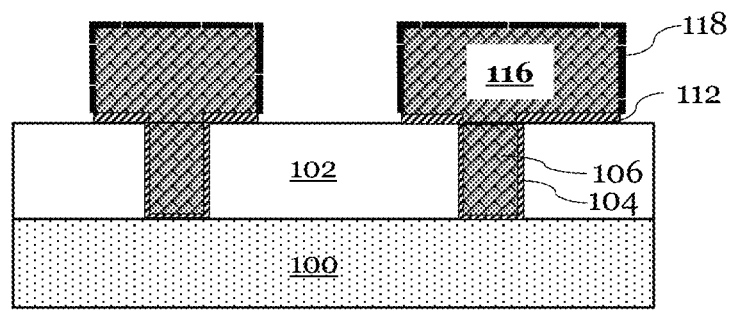

In block 111, and the cross-section in FIG. 1H, further processing includes selectively depositing approximately one monolayer of graphene on all exposed surfaces of the Cu interconnect leads 116. In this example, the graphene barrier layer 118 is deposited on the top surface and on the sidewalls of the Cu interconnect leads 116. One example includes the catalytic CVD decomposition of a hydrocarbon gas that deposits graphene selectively on the exposed Cu surfaces and does not deposit graphene on the first dielectric layer ILD1 102. The copper surface must be free of oxidation to catalyze the deposition of the graphene barrier layer 118. A precleaning process step such as an isopropyl alcohol wet clean, a citric acid wet clean, or a hydrogen plasma treatment may be performed immediately prior to graphene deposition. The precleaning process may be performed in the same chamber performing the selective deposition of graphene in some embodiments.

An exposed copper surface heated to a temperature between 250° C. and 450° C. may act as the catalyst for the thermal decomposition of a hydrocarbon gas such as ethylene and acetylene. Very thin sheets, approximately monolayers of graphene, form on the surface of the copper grains. The thickness of the graphene barrier layer 118 may range between about 3 angstroms and 2 nm. Defects and grain boundaries 119 between individual sheets of the graphene may form in the thin graphene barrier layer 118 through which Cu can diffuse. During a subsequent anneal, Mn atoms diffuse out of the Mn doped copper to self-form MnSiO barrier layers that block Cu diffusion through these defects 119.

The hydrocarbon gas may be diluted in an inert carrier gas such as nitrogen, helium, or argon. The graphene layer 118 may be deposited in an LPCVD furnace or in a single wafer CVD deposition tool. The flow rate of the hydrocarbon gas may vary greatly depending upon whether the process is a single wafer process or a batch process and may range from 10 sccm to 10000 sccm or more in various embodiments. The deposition time may also vary greatly depending upon if the process is a single wafer process or a batch process and may range from 5 min. to an hour or more. Plasma enhanced CVD (PECVD) may be used to lower the deposition temperature in some embodiments. The hydrocarbon gas may comprise ethylene or acetylene.

Figure 1I:
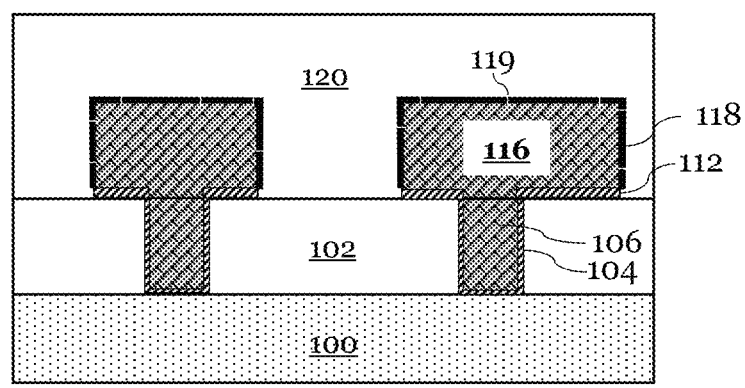

In block 113 and the cross-section in FIG. 1I, illustrates the film structure following deposition of a second dielectric layer ILD2 120 that covers the graphene barrier layer 118 on the Cu interconnect leads 116. The second dielectric layer ILD2 120 may comprise a dielectric material such as oxide, oxynitride, and other low-k materials such as fluorine-doped silicon dioxide, organosilicate glass including carbon doped oxides, porous materials including porous silicon dioxide, porous organosilicate glass, and other spin-on dielectrics. The second dielectric layer ILD2 120 may also include air gaps in some embodiments. The second dielectric layer ILD2 120 may be deposited using thermal processes, vapor deposition processes such as CVD, PECVD, and spin-on processes in various embodiments.

Figure 1J:
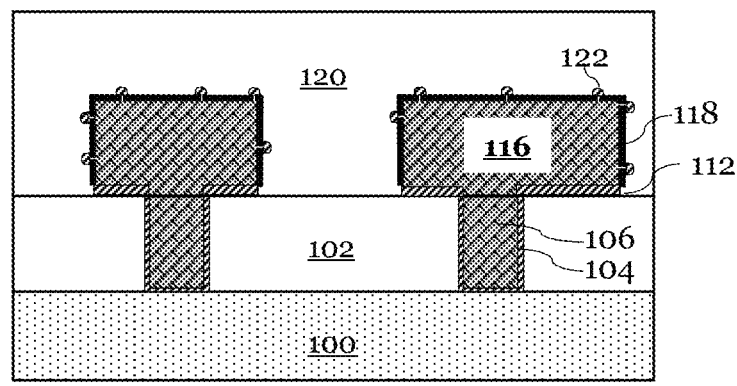

Block 115 and the cross-section in FIG. 1J shows the film structure following a second heat-treatment that thermally diffuses the Mn out of the Cu film 110 through defects 119 in the graphene barrier layer 118 to the surface of the second dielectric layer ILD2 120. The Mn reacts with Si and O in the second dielectric layer ILD2 120 to self-form a Mn-containing diffusion barrier layer (MnSiO barrier layer 122). The self-formed MnSiO barrier layer 122 may be formed as several discontinuous regions around the graphene barrier layer 118 in locations around the defects 119. The self-formed MnSiO barrier layer 122 blocks Cu diffusion through the defects 119 similar to plugging holes in the graphene barrier layer 118 for copper to diffuse through. The formation of the Mn-containing diffusion barrier layer 122 is self-limiting upon contacting the Mn with the second dielectric layer ILD2. The heat-treating can include heating the substrate 100 to a temperature between 200° C. and 500° C. in an inert gas such as nitrogen.

Together, the selectively deposited graphene barrier layer 118 and the self-formed MnSiO barrier layer 122 (selective graphene and Mn barrier scheme) provides a reliable barrier against copper electromigration into interlayer dielectrics. Advantageously, the defect level of the graphene barrier layer 118 does not have to be tightly controlled since the self-formed MnSiO barrier layer 122 provides a stop plug. Thus, the selective graphene and Mn barrier scheme discussed in various embodiments has the advantages over previous barrier schemes of being very thin and therefore lower resistance than previous barriers. The selective graphene and Mn barrier scheme also provides an atomically smooth surface between the graphene layer 118 and the copper interconnect lead 116 that reduces carrier scattering (higher carrier mobility) resulting in reduced copper interconnect lead 116 resistance.

The film structure may be further processed by etching new vias in the second dielectric layer ILD2 120, filling the new vias with metal, planarizing the new metal filled vias to form second dielectric layer ILD2 120 and the new metal-filled vias in the same horizontal plane, and then repeating blocks 103 through 117 in FIG. 1A to add an additional level of interconnect. Additional levels of interconnect may be added by repeating the embodiment processes. Thus each level of metallization may include the selective graphene and Mn barrier scheme.

Figure 2A:
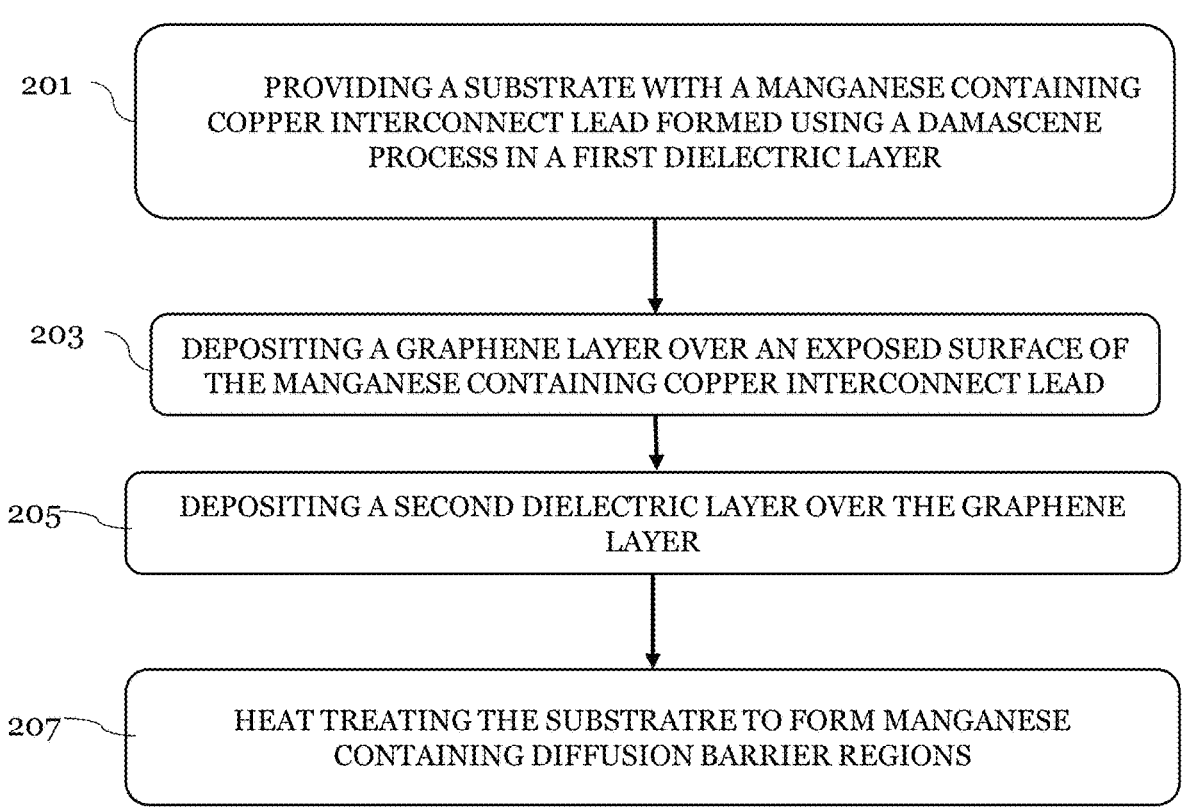
FIG. 2A is a flow diagram describing the formation of a selective copper barrier scheme on damascene copper leads using manganese and graphene and describing fabrication of a semiconductor device in accordance with embodiments.

FIG. 2A is a flow diagram describing formation of a copper barrier on damascene copper using Mn and graphene and describing fabrication of a semiconductor device in accordance with embodiments.

FIGS. 2B-2E schematically show through cross-sectional views a method for forming a device according to an embodiment of the invention.

Figure 2B:
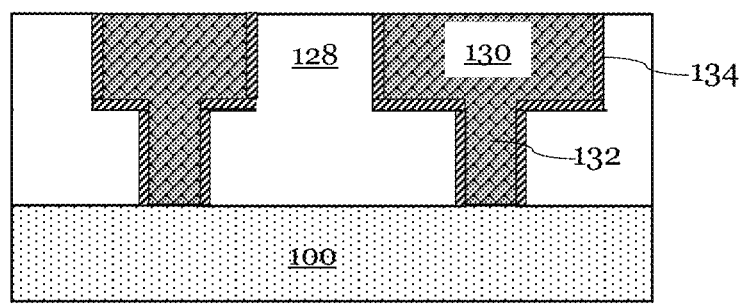
FIGS. 2B-2E are cross sectional views of a semiconductor during various stages of fabrication in various embodiments and depicting steps in the flow diagram of FIG. 2A.

Referring now to block 201 in FIG. 2A and the cross-section in FIG. 2B, a substrate with Mn doped copper interconnect leads 130 formed using a damascene process in a silicon and oxygen containing first dielectric ILD1 128 is provided. In damascene processes, trenches are etched into the first dielectric layer ILD1 128, filled with a metal, and then planarized using chemical mechanical polish (CMP). The damascene process can be either single damascene or dual damascene. In a single damascene process the metal filled vias 132 are formed using a first damascene process and the metal filled interconnect trenches are formed with a second damascene process. In the more commonly used dual damascene process, via trenches and interconnect trenches are first formed in the first dielectric layer ILD1 128. The dual via and interconnect trenches are simultaneously filled using a single damascene process.

In FIG. 2B the Mn doped copper interconnect leads 130 and metal filled vias 132 are formed in first dielectric layer ILD1 128. In various embodiments, first dielectric layer ILD1 128 may comprise a dielectric material that contains silicon and oxygen such as silicon dioxide, silicon oxynitride, and other low-k materials such as fluorine-doped silicon dioxide, organosilicate glass including carbon doped oxides, porous materials including porous silicon dioxide, porous organosilicate glass, and other spin-on dielectrics. The ILD1 128 may also include air gaps in some embodiments. The first dielectric layer ILD1 128 may be deposited using thermal processes, chemical vapor deposition (CVD) processes such as CVD, low pressure CVD (LPCVD), atmospheric pressure CVD (APCVD), sub-atmospheric pressure CVD (SACVD), plasma enhanced CVD (PECVD), and spin-on processes in various embodiments.

The first dielectric layer (ILD1) 128 is deposited on a substrate layer 100 such as a semiconductor substrate. The semiconductor substrate can be a substrate 100 such as single crystal silicon, silicon on insulator, single crystal germanium, single crystal silicon carbide, or single crystal gallium arsenide as well other compound semiconductor substrate. The substrate 100 may also include one or more epitaxial layers including hetero-epitaxial layers, e.g., gallium nitride on silicon. The substrate 100 under the first dielectric layer ILD1 128 can contain electronic devices such as transistors, resistors, capacitors, inductors, and others. Barrier layer 134 between the Mn doped copper interconnect leads 130 and first dielectric layer ILD1 128 prevents copper from electromigrating into and degrading the first dielectric layer ILD1 128. In one example, the barrier layer 134 may contain Ta, TaN, Ti, TiN. TiW, or WN. In one example, the barrier layer 134 further includes manganese (Mn), nitrides such as MnN, and oxides such as MnO. The barrier layer 134 comprises manganese (Mn) metal in one embodiment. The barrier layer 134 may be deposited using a physical vapor deposition (PVD) including sputtering, a chemical vapor deposition (CVD) method including plasma enhanced CVD (PECVD), atomic layer deposition (ALD), ion metal plasma (IMP) deposition, and others.

Figure 2C:
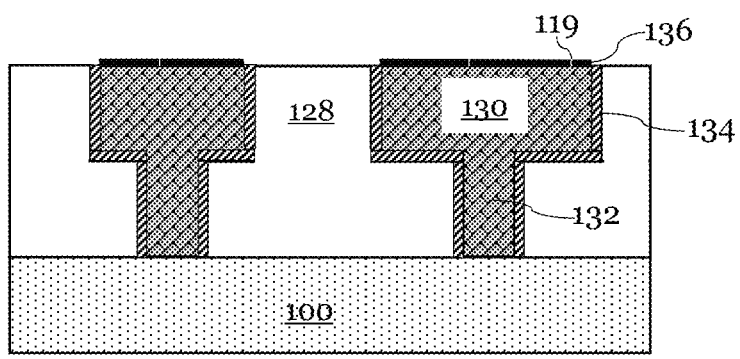

In the cross-section FIG. 2C and block 203, further processing includes selectively depositing approximately one monolayer of a graphene barrier layer 136 on the exposed surfaces of the damascene Mn doped Cu interconnect 130. In this example, a graphene barrier layer 136 is selectively deposited on the top surface of the Mn doped Cu interconnect leads 130.

An exposed copper surface heated to a temperature between 250° C. and 450° C. may act as the catalyst for the thermal decomposition of a hydrocarbon gas such as ethylene and acetylene. Very thin sheets, approximately monolayers of graphene, may form on the surface of the copper grains. The thickness of the graphene barrier layer 136 may range between about 3 angstroms and 2 nm. Defects 119 such as grain boundaries and line defects between individual sheets of the graphene may form in the thin graphene barrier layer 136 through which Cu can diffuse. During a subsequent anneal, Mn atoms diffuse out of the Mn doped copper to self-form MnSiO barrier layers 140 that block Cu diffusion through these defects 119.

In various embodiments, the hydrocarbon gas may be diluted in an inert carrier gas such as nitrogen, helium, or argon. The graphene layer 136 may be deposited in a batch LPCVD furnace or in a single wafer CVD deposition tool. The flow rate of the hydrocarbon gas may vary greatly depending upon whether the process is a single wafer process or a batch process and may range from 10 sccm to 10000 sccm or more in various embodiments. The deposition time may also vary greatly depending upon if the process is a single wafer process or a batch process and may range from 5 min. to an hour or more. Plasma enhanced CVD (PECVD) may be used to lower the deposition temperature in some embodiments.

Figure 2D:
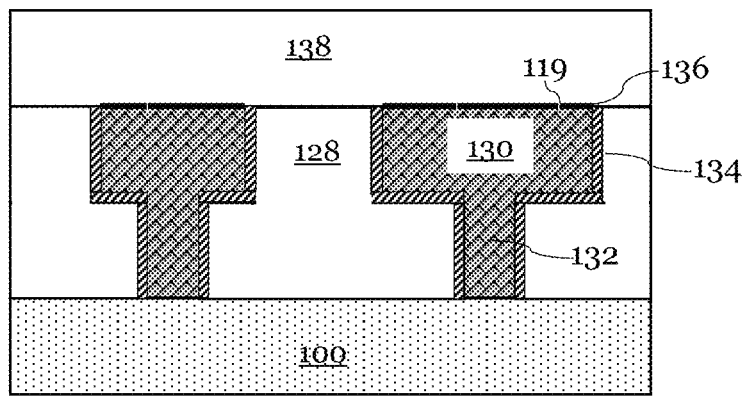

In block 205 of FIG. 2A and the cross-sectional view in FIG. 2D, a second silicon and oxygen containing dielectric layer (ILD2) 138 is deposited on the graphene barrier layer 136 and on the first dielectric layer 128. In various embodiments, second dielectric layer ILD2 138 may comprise dielectric materials such as silicon dioxide, silicon oxynitride, and other low-k silicon and oxygen containing materials such as fluorine-doped silicon dioxide, organosilicate glass including carbon doped siliconoxides, porous materials including porous silicon dioxide, porous organosilicate glass, and other spin-on dielectrics. The second dielectric layer ILD2 138 may also include air gaps in some embodiments. The second dielectric layer ILD2 138 may be deposited using thermal processes, chemical vapor deposition (CVD) processes such as CVD, low pressure CVD (LPCVD), atmospheric pressure CVD (APCVD), sub-atmospheric pressure CVD (SACVD), plasma enhanced CVD (PECVD), and spin-on processes in various embodiments.

Figure 2E:
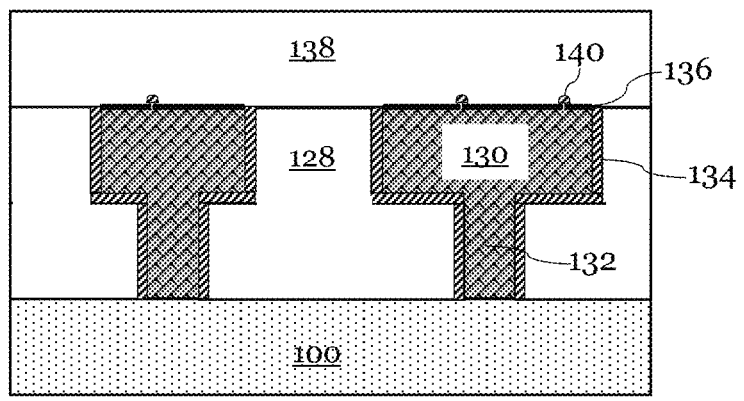

In block 207 of FIG. 2A and the cross-sectional view in FIG. 2E, an anneal is performed causing Mn to diffuse out of the Mn doped Cu interconnect leads 130 and through defects 119 in the graphene barrier layer 136 to the interface between the Mn doped Cu interconnect leads 130 and the second dielectric layer ILD2 138 interfaces. The Mn reacts with the Si and O in the ILD2 layer 138 to self-form MnSiO barrier layers 140. The self-formed MnSiO barrier layers 140 may be formed as several discontinuous regions around the graphene barrier layer 136 in locations around the defects 119. The self-formed MnSiO barrier layers 140 block Cu from diffusing or electro-migrating into the second dielectric layer ILD2 138 through defects 119 in the graphene barrier layer 136. The anneal can be performed in a batch annealing tool such as a furnace or in a single wafer annealing tool such as a rapid thermal anneal chamber. In various embodiments, the annealing may be furnace annealing, rapid thermal annealing, flash annealing, and others. During the anneal, the substrate 100 is loaded into the annealing chamber and heated to a temperature between 200° C. and 500° C. in an inert atmosphere such as argon or nitrogen. In one embodiment, the annealing may be performed between 300° C. and 400° C. In various embodiments, the substrate 100 may be annealed for a time duration of 60 s to 3600 s.

The selective graphene plus Mn barrier provides a reliable barrier blocking copper electromigration into surrounding interlayer dielectrics. The selective graphene plus self-formed MnSiO barrier scheme provides a very thin copper diffusion barrier with low electrical resistance. The selective graphene plus self-formed MnSiO barrier also provides an atomically smooth surface between the graphene barrier layer 136 and the Mn doped copper interconnect lead 130 improving carrier mobility and lowering resistance.

Another layer of Mn doped copper interconnect can be formed in the second dielectric layer ILD2 138 following the same embodiment procedure. Additional levels of interconnect may be added by repeating the embodiment processes. Thus each level of metallization may include the selective graphene and Mn barrier scheme.

Figure 3A:
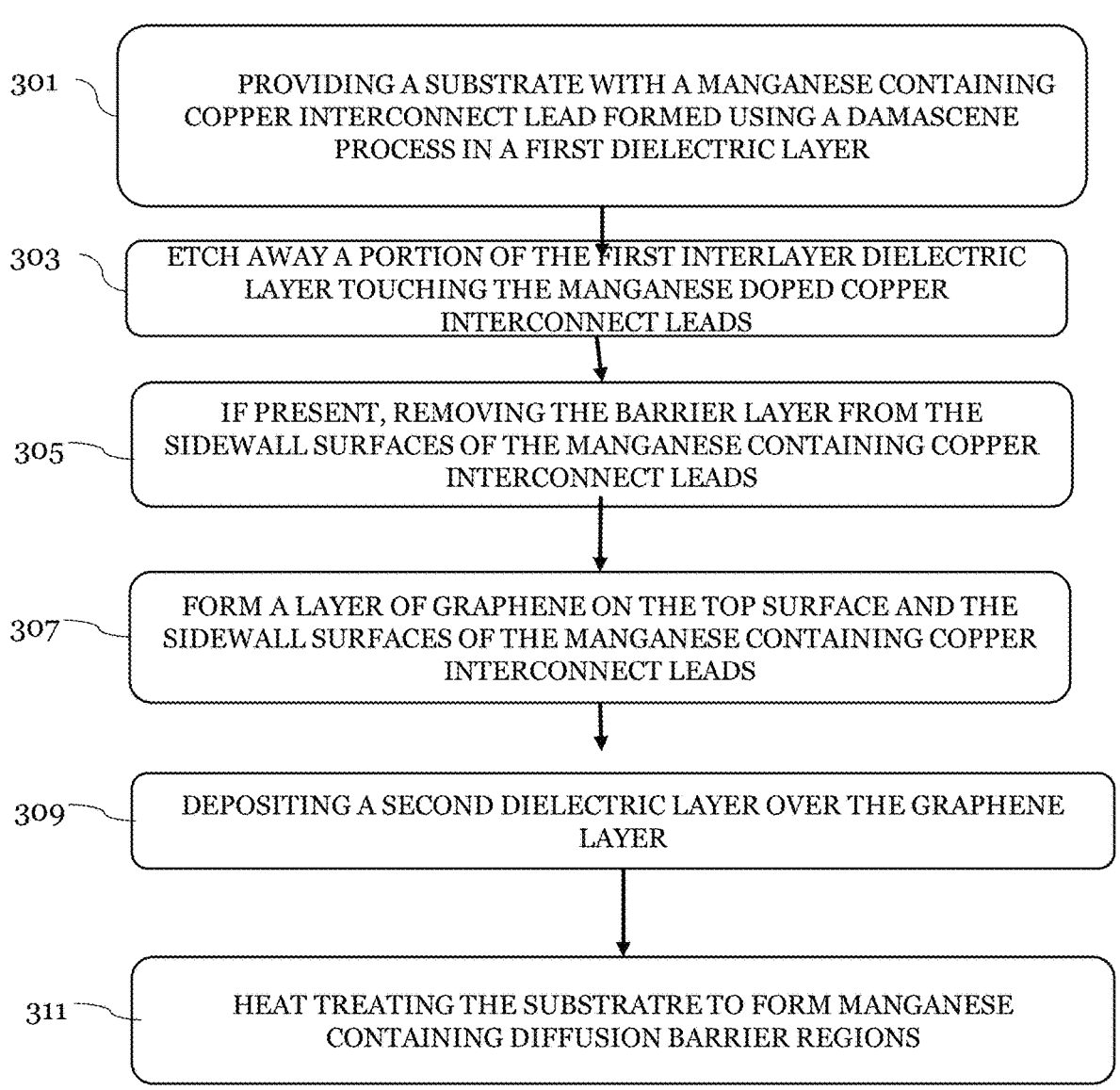
FIG. 3A is a flow diagram describing the formation of a selective copper barrier scheme on damascene copper leads using manganese and graphene and describing fabrication of a semiconductor device in accordance with embodiments.

FIG. 3A is a flow diagram describing another process for the formation of a selective copper barrier on damascene copper using Mn and graphene and describing fabrication of a semiconductor device in accordance with embodiments. This process can be implemented using either a single damascene or dual damascene.

FIGS. 3B-3G schematically illustrate through cross-sectional views the steps in the flow diagram in FIG. 3A for forming a device according to an embodiment of the invention.

Figure 3B:
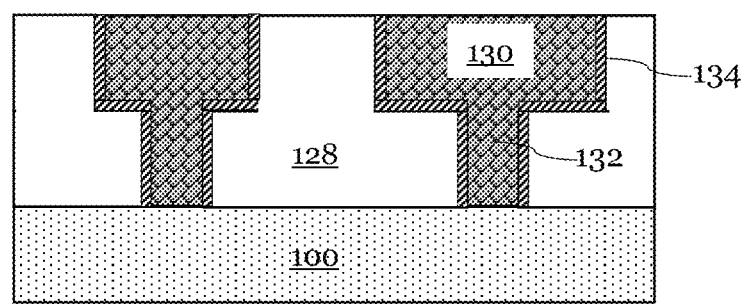
FIGS. 3B-3G are cross sectional views of a semiconductor device during various stages of fabrication in various embodiments and depicting steps in the flow diagram of FIG. 3A.

Refer now to block 301 in FIG. 3A and the cross-section in FIG. 3B. FIG. 3B is a cross-sectional view of Mn doped copper interconnect leads 130 that are formed with a damascene process in a silicon and oxygen containing first dielectric layer ILD1 128. In the damascene processes, interconnect trenches are etched into the first dielectric layer ILD1 128, filled with Mn containing copper, and then planarized using chemical mechanical polish (CMP).

Figure 3C:
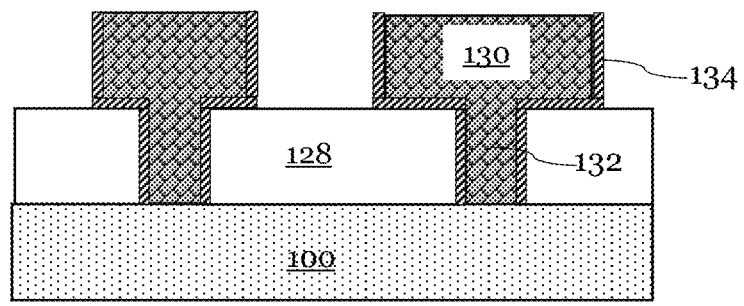

In the cross-section FIG. 3C and block 303, further processing includes etching away the portion of the first dielectric layer ILD1 128 adjacent to the Mn doped copper interconnect leads 130 to additionally expose the sidewalls of the Mn doped copper interconnect leads 130. A barrier layer 134 covering the sidewalls of the Mn doped copper interconnect leads 130 (if present) is also exposed. The first dielectric layer ILD1 128 when comprising silicon and oxygen or silicon, oxygen, and nitrogen may be plasma etched using fluorocarbon gases such as $CF_4$ and $CHF_3$ plus oxygen diluted in a carrier gas such as argon or helium.

Figure 3D:
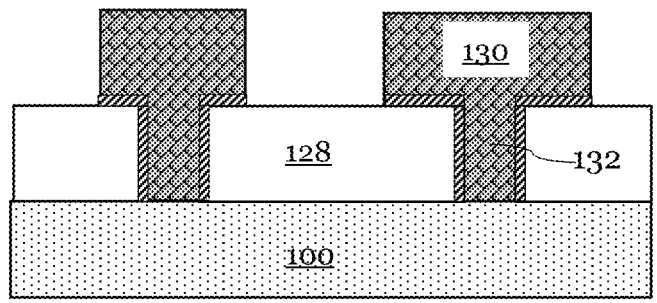

In block 305 of FIG. 3A and cross-section FIG. 3D, the barrier layer 134 (if present) is etched away exposing the sidewall surfaces of the Mn doped Cu interconnect lead 130. Barrier layers 134 such as TiN and TaN may be plasma etched in an inductively coupled plasma (ICP) reactor using $Cl_2$ or HBr diluted in a carrier gas such as argon or helium. To ensure the copper surface is free of oxidation, a precleaning process step such as an isopropyl alcohol wet clean, a citric acid wet clean, or a hydrogen plasma treatment can be performed immediately prior to graphene barrier layer 150 deposition. The precleaning process may be performed in the same chamber as the selective deposition of graphene in some embodiments.

Figure 3E:
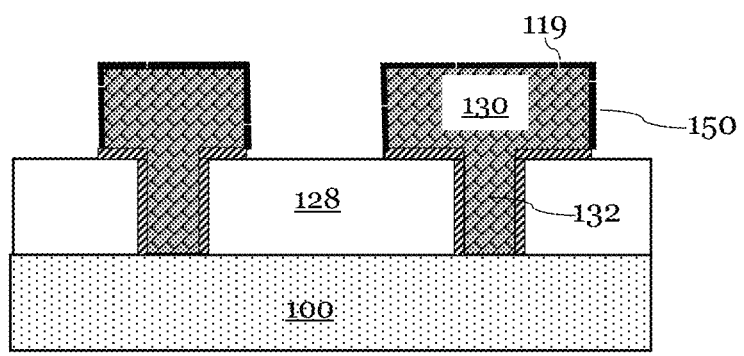

In block 307 of FIG. 3A and cross-section FIG. 3E approximately one monolayer of graphene is deposited on the exposed top and sidewall surfaces of the Mn doped Cu interconnect leads 130. The exposed copper surfaces, when heated to a temperature between 250° C. and 450° C., catalyze the thermal decomposition of a hydrocarbon gas such as ethylene and acetylene to form very thin sheets, approximately monolayers, of graphene on exposed copper surfaces. The thickness of the graphene barrier layer 150 may range between about 3 angstroms and 2 nm. Defects and grain boundaries 119 between individual sheets of the graphene may form in the thin graphene barrier layer 150 through which Cu can diffuse. During a subsequent anneal, Mn atoms diffuse out of the Mn doped copper to self-form MnSiO barrier layers 154 that block Cu diffusion through the defects 119.

The hydrocarbon gas may be diluted in an inert carrier gas such as nitrogen, helium, or argon. The graphene barrier layer 150 may be deposited in an LPCVD furnace or in a single wafer CVD deposition tool. The flow rate of the hydrocarbon gas may vary greatly depending upon whether the process is a single wafer process or a batch process and may range from 10 sccm to 10000 sccm or more in various embodiments. The deposition time may also vary greatly depending upon if the process is a single wafer process or a batch process and may range from 5 min. to an hour or more. Plasma enhanced CVD (PECVD) may be used to lower the deposition temperature in some embodiments.

Figure 3F:
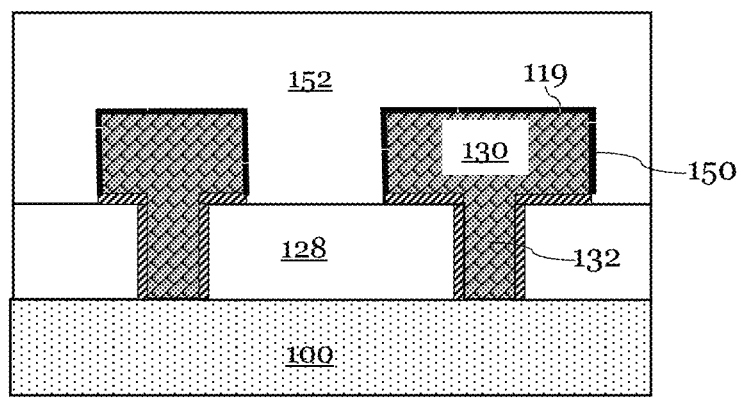

In block 309 of FIG. 3A and the cross-sectional view in FIG. 3F, a second dielectric layer (ILD2) 152 containing silicon and oxygen is deposited on the graphene barrier layer 150 and on the first dielectric layer ILD1 128. In various embodiments, the second dielectric layer ILD2 152 may comprise a silicon and oxygen containing dielectric material such as silicon oxide, silicon oxynitride, and low-k materials such as fluorine-doped silicon dioxide, organosilicate glass including carbon doped oxides, porous materials including porous silicon dioxide, porous organosilicate glass, and other silicon and oxygen containing spin-on dielectrics. The second dielectric layer ILD2 152 may also include air gaps in some embodiments. The second dielectric layer ILD2 152 may be deposited using thermal processes, chemical vapor deposition (CVD) processes such as CVD, low pressure CVD (LPCVD), atmospheric pressure CVD (APCVD), sub-atmospheric pressure CVD (SACVD), plasma enhanced CVD (PECVD), and spin-on processes in various embodiments.

Figure 3G:
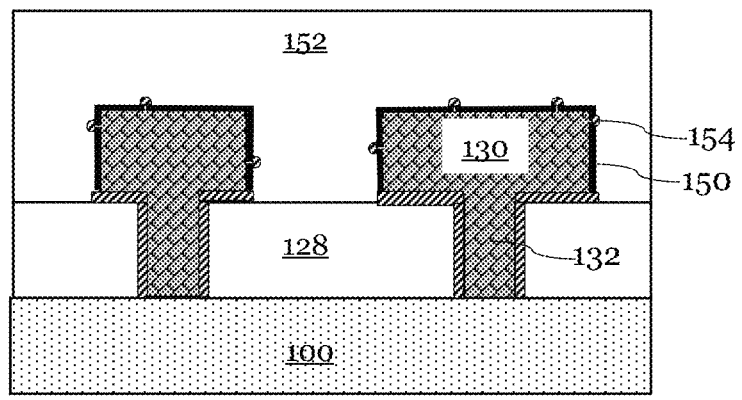

In block 311 of FIG. 3A and the cross-sectional view in FIG. 3G, an anneal is performed causing Mn to diffuse out of the Mn doped Cu interconnect lead 130 and through defects 119 in the graphene barrier layer 150 to the Mn doped Cu interconnect 130/second dielectric layer ILD2 152 interfaces. The Mn reacts with the Si and O in the second dielectric layer ILD2 152 to self-form MnSiO barrier layers 154 which block Cu from diffusing or electro-migrating into and degrading the second dielectric layer ILD2 152. The self-formed MnSiO barrier layer 154 may be formed as several discontinuous regions around the graphene barrier layer 150 in locations around the defects 119. The annealing can be performed in a batch furnace or in a single wafer annealing chamber. During the annealing, the substrate 100 may be heated to a temperature between 200° C. and 500° C. In one embodiment, the annealing may be performed between 300° C. and 400° C. In various embodiments, the substrate 100 may be annealed for a time duration of 60 s to 3600 s.

An advantage of this embodiment over the embodiment described in FIGS. 2A-2E is that it forms the selective graphene barrier layer 150 plus self-formed MnSiO barrier layer 154 on the sidewall surfaces of the Mn doped copper interconnect leads 130 in addition to forming the barrier layers on the top surface. Formation of the barrier on the sidewalls additionally reduces the resistance of the Mn doped Cu interconnect leads 130. In this embodiment, the selective graphene barrier layer 150 plus self-formed MnSiO barrier layer 154 provides reliability by blocking copper electromigration into the surrounding second dielectric layer ILD2 152. The selective graphene plus self-formed MnSiO barrier layer 154 is very thin (about a monolayer) providing exceptionally low electrical resistance. The selective graphene barrier layer 150 plus self-formed MnSiO barrier layer 154 also provides an atomically smooth surface between the graphene barrier layer 150 and the Mn doped copper interconnect lead 130 improving carrier mobility and lowering lead resistance.

Additional layers of Mn doped copper interconnect can be formed on the second dielectric layer ILD2 152 by repeating the embodiment procedure. Thus, each level of metallization may include the selective graphene and Mn barrier scheme.

Figure 4A:
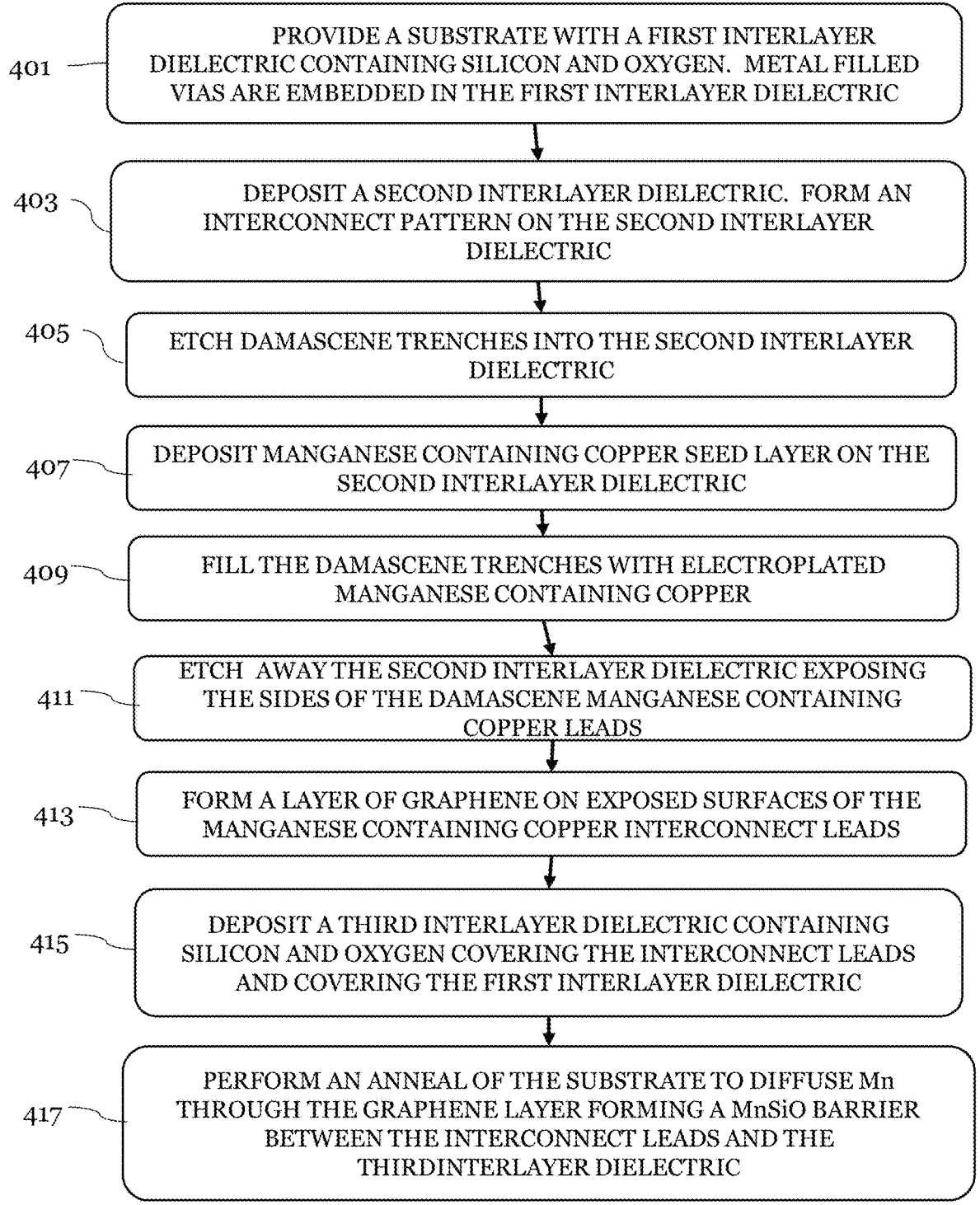
FIG. 4A is a flow diagram describing the formation of a selective copper barrier scheme on damascene copper leads using manganese and graphene and describing fabrication of a semiconductor device in accordance with embodiments.

FIG. 4A is a flow diagram describing a process for the formation of a selective copper barrier layer on damascene copper using Mn and graphene and describing fabrication of a semiconductor device in accordance with embodiments. This process may further reduce the complexity and cost of damascene embodiments by eliminating barrier layer formation prior to copper electroplating and also by eliminating barrier layer removal prior to graphene barrier layer deposition.

FIGS. 4B-4I schematically illustrate through cross-sectional views of the steps in the flow diagram in FIG. 4A for forming a device according to an embodiment of the invention.

Figure 4B:
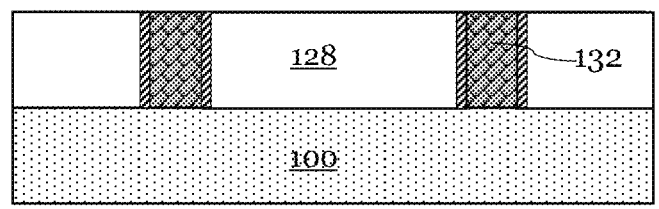
FIGS. 4B-4J are cross sectional views of a semiconductor device during various stages of fabrication in various embodiments and depicting steps in the flow diagram of FIG. 4A.

Referring now to block 401 in FIG. 4A and the cross-section in FIG. 4B. FIG. 4B is a cross-sectional view of a substrate 100 overlaid with a first dielectric layer 128. Metal filled vias 132 (optional) protrude through the first dielectric layer 128 stopping on the substrate 100. The substrate 100 may be a semiconductor substrate containing electrical devices such as transistors, resistors, capacitors, diodes, and memory cells. The first dielectric layer 128 can be a dielectric material such as silicon oxide, silicon oxynitride, and low-k materials such as fluorine-doped silicon dioxide, organosilicate glass including carbon doped oxides, porous materials including porous silicon dioxide, porous organosilicate glass, and other silicon and oxygen containing spin-on dielectrics. The first dielectric layer 128 may also include air gaps in some embodiments. The first dielectric layer 128 may be deposited using thermal processes, chemical vapor deposition (CVD) processes such as CVD, low pressure CVD (LPCVD), atmospheric pressure CVD (APCVD), sub-atmospheric pressure CVD (SACVD), plasma enhanced CVD (PECVD), and spin-on processes in various embodiments. The metal filled vias 132 can be filled with a metal such as tungsten, copper, ruthenium, iridium, cobalt, and nickel.

Figure 4C:
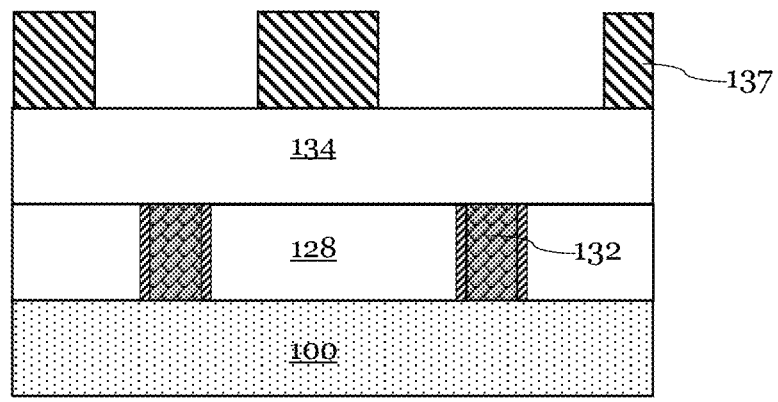

In block 403 and the cross-sectional view in FIG. 4C, a disposable second dielectric layer 134 is deposited on the first dielectric layer 128. In an embodiment, the disposable second dielectric layer 134 can be a dielectric layer such as the material of first dielectric layer 128 and deposited in like manner. A damascene trench pattern 137 may be formed over the disposable second dielectric layer 134 using conventional lithography techniques.

Figure 4D:
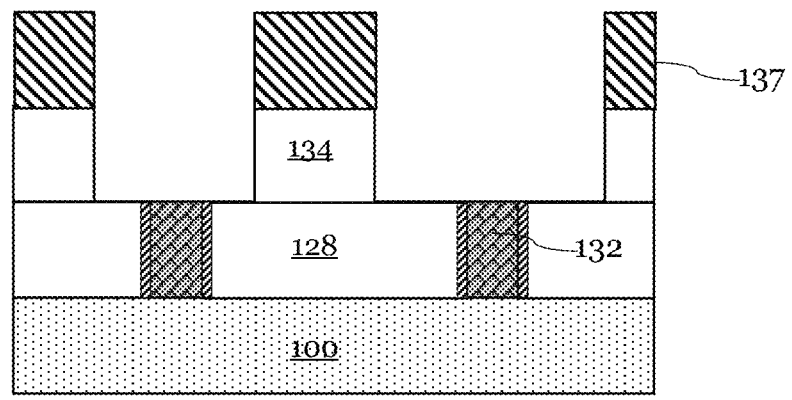

In block 405 and the cross-sectional view in FIG. 4D, damascene trenches are etched into the disposable second dielectric layer 134. The top surfaces of the metal filled vias 132 (if present) are exposed.

Figure 4E:
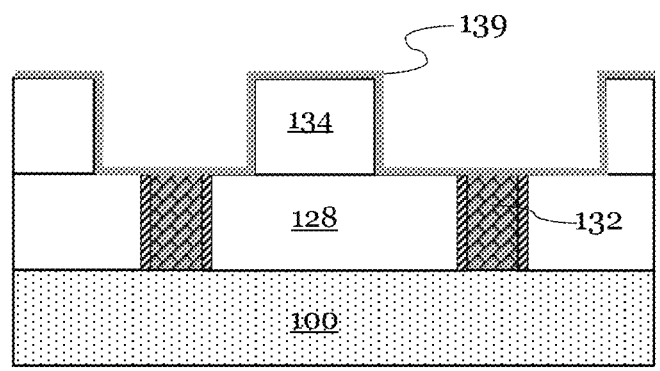

In block 407 and the cross section in FIG. 4E, the damascene trench pattern 137 is removed and a thin manganese containing copper seed layer 139 is deposited on the surface of the disposable second dielectric layer 134 and on the surfaces of the damascene trenches etched into the disposable second dielectric layer 134. In a conventional copper damascene process, the copper seed layer 139 is deposited on top of a copper barrier layer such as Ti, TiN, Ta, or TaN. In this embodiment, the copper barrier layer deposition may be omitted. The copper seed layer 139 helps to conduct electricity during the initial stages of the copper electroplating. The seed layer 139 can be deposited using various physical vapor deposition methods such as sputtering, evaporation, and ion metal plasma deposition. In this embodiment, since the disposable second dielectric layer 134 will be removed, degradation of the disposable second dielectric layer 134 due to copper electromigration is of no concern. Omitting the deposition of a conventional barrier layer such as Ti, TiN, Ta, and TaN reduces costs by eliminating the deposition tools and deposition materials, and by reducing cycle time.

Figure 4F:
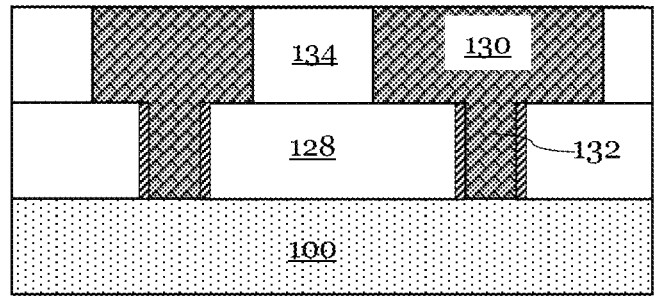

Referring now to block 409 in FIG. 4A and the cross-section in FIG. 4F, in the damascene processes, the damascene trenches are filled with electroplated manganese containing copper and then planarized using chemical mechanical polish (CMP). During the CMP planarization process, any excess electroplated copper overfill and the copper seed layer 139 are polished off the surface of the planarized second dielectric 134.

Figure 4G:
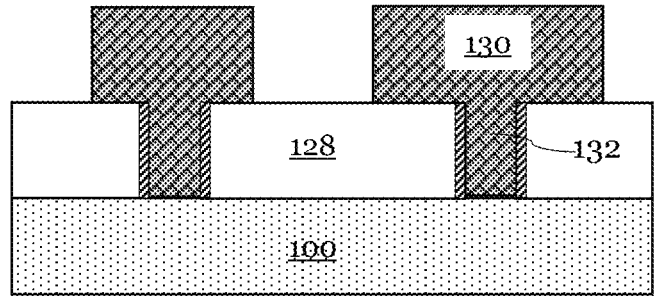

In the cross-section view illustrated in FIG. 4G and block 411 further processing includes etching away the first dielectric layer ILD1 128 adjacent to the Mn doped copper interconnect leads 130 additionally exposing the sidewalls of the Mn doped copper interconnect leads 130. In this embodiment, since no barrier layer covers the sidewalls of the Mn doped copper interconnect leads 130, the equipment, materials, and processing time required to remove conventional barrier layers such as Ti, TiN, Ta, and TaN are eliminated reducing processing cost.

Figure 4H:
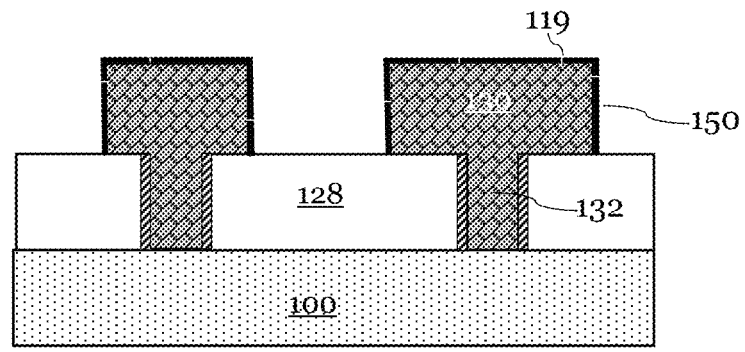

In block 413 of FIG. 4A and cross-section view illustrated in FIG. 4H, approximately one monolayer of a graphene barrier layer 150 is deposited on the exposed top and sidewall surfaces of the Mn doped Cu interconnect leads 130 as described previously.

Figure 4I:
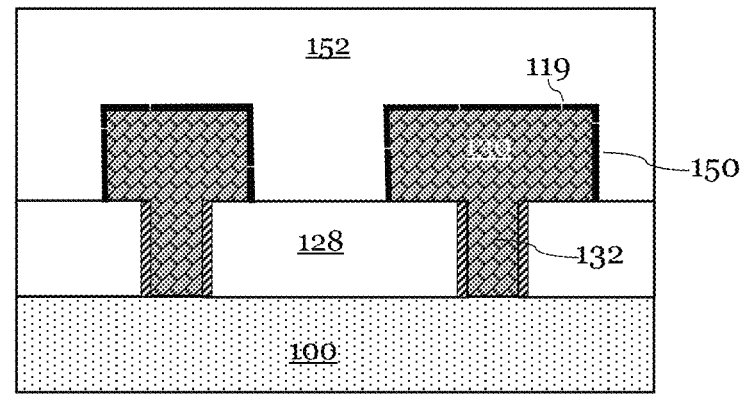

In block 415 of FIG. 4A and the cross-sectional view illustrated in FIG. 4I, a third dielectric layer (ILD3) 152 containing silicon and oxygen is deposited on the graphene barrier layer 150 and on the first dielectric layer ILD1 128 as described previously.

Figure 4J:
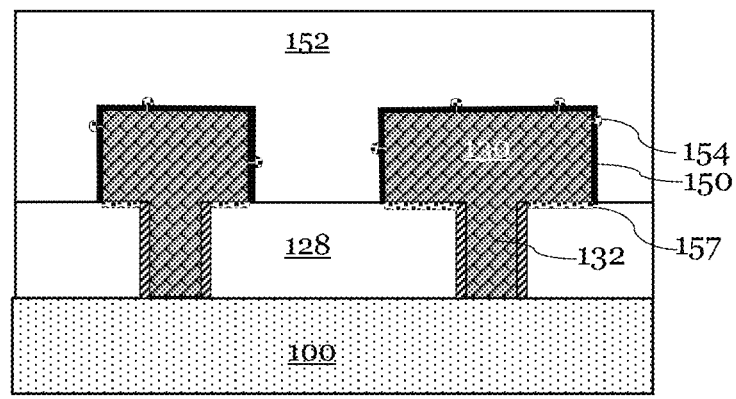

In block 417 of FIG. 4A and the cross-sectional view illustrated in FIG. 4J, an anneal is performed causing Mn to diffuse out of the Mn doped Cu interconnect lead 130 and through defects 119 in the graphene barrier layer 150 to the Mn doped Cu interconnect 130/third dielectric layer ILD3 152 interfaces. During the anneal, Mn diffuses from the Mn containing copper seed layer 139 and from the Mn containing copper lead 130 to form a MnSiO barrier layer 157 between the bottom of the Mn containing copper lead 130 and the top surface of first dielectric layer 128.

An advantage of this embodiment over the embodiment described in FIGS. 3A-3G is that it eliminates the processing equipment, processing chemicals, and cycle time required to first deposit a copper barrier layer on the interlayer dielectric prior to copper deposition. It also eliminates the processing equipment, processing chemicals, and cycle time required to remove the copper barrier layer prior to graphene barrier layer deposition. In this embodiment copper leads with an embodiment thin, low resistance barrier layer are formed using a low-cost copper damascene process.

Example embodiments of the invention are summarized here. Other embodiments can also be understood from the entirety of the specification as well as the claims filed herein.

Example 1. A method of forming a semiconductor device includes providing a substrate having a patterned film including manganese; depositing a graphene layer over exposed surfaces of the patterned film; depositing a dielectric layer containing silicon and oxygen over the graphene layer; and heat-treating the substrate to form a manganese-containing diffusion barrier region between the graphene layer and the dielectric layer.

Example 2. The method of example 1, where the manganese-containing diffusion barrier region includes manganese, silicon, and oxygen.

Example 3. The method of one of examples 1 or 2, where the heat-treating includes heating the substrate to a temperature between 200° C. and 500° C.

Example 4. The method of one of examples 1 to 3, further including performing a damascene process to form the patterned film in another dielectric layer below the dielectric layer, the patterned film forming a copper interconnect lead.

Example 5. The method of one of examples 1 to 4, further including: prior to depositing the graphene layer, etching away a portion of the another dielectric layer adjacent to the patterned film to expose sidewalls of the patterned film.

Example 6. The method of one of examples 1 to 5, further including removing a barrier layer from the sidewalls of the patterned film.

Example 7. The method of one of examples 1 to 6, where the exposed surface is the top surface and the sidewall surfaces of the patterned film.

Example 8. The method of one of examples 1 to 7, further including performing a dual damascene process to form the patterned film in another dielectric layer below the dielectric layer, the patterned film forming a copper interconnect lead.

Example 9. The method of one of examples 1 to 8, where the patterned film includes copper alloy doped with the manganese.

Example 10. The method of one of examples 1 to 9, where the patterned film further includes ruthenium, cobalt, tungsten, nickel, or iridium.

Example 11. A method of forming a semiconductor device includes providing a substrate containing a metallization layer and a first dielectric layer containing silicon and oxygen; depositing a barrier layer over the metallization layer and over the first dielectric layer; depositing a conductive film containing manganese over the barrier layer; heat-treating the substrate for a first time to form a first manganese-containing diffusion barrier region between the barrier layer and the first dielectric layer; patterning and etching the conductive film to form a patterned conductive film over the first manganese-containing diffusion barrier region; depositing a graphene layer over a sidewall surface and on a top surface of the conductive film; depositing a second dielectric layer containing silicon and oxygen on the graphene layer; and heat-treating the substrate for a second time to form a second manganese-containing diffusion barrier region.

Example 12. The method of example 11, where the first and the second manganese-containing diffusion barrier regions include manganese, silicon, and oxygen.

Example 13. The method of one of examples 11 or 12, where the heat-treating for the first and second times includes heating the substrate to a temperature between 200° C. and 500° C.

Example 14. The method of one of examples 11 to 13, where the heat-treating for the first time dissolves the barrier layer between the metallization layer and the conductive film.

Example 15. The method of one of examples 11 to 14, where the conductive film includes copper and the barrier layer includes manganese.

Example 16. A semiconductor device includes substrate containing a patterned copper film containing manganese; a graphene layer disposed over exposed surfaces of the patterned copper film; a first manganese-containing diffusion barrier layer disposed over portions of the graphene layer; and a first dielectric layer containing silicon and oxygen disposed over the first manganese-containing diffusion barrier layer and over the graphene layer.

Example 17. The semiconductor device of example 16, further including: a second dielectric layer containing silicon and oxygen; a barrier layer between the patterned copper film and the second dielectric layer; and a second manganese-containing diffusion barrier layer between the second dielectric layer and the barrier layer.

Example 18. The semiconductor device of one of examples 16 or 17, where the first and second manganese-containing diffusion barrier layers contain manganese, silicon, and oxygen.

Example 19. The semiconductor device of one of examples 16 to 18, where the barrier layer contains manganese.

Example 20. The semiconductor device of one of examples 16 to 19, where the graphene layer is approximately one monolayer thick.

Example 21. A method of forming a semiconductor device includes providing a substrate with a manganese containing copper interconnect lead formed using a damascene process in a first dielectric layer; depositing a graphene layer over an exposed surface of the manganese containing copper interconnect lead; depositing a second dielectric layer over the graphene layer; and heat-treating the substrate to form manganese-containing diffusion barrier regions.

Example 22. The method of example 21, where the exposed surface is the top surface of the manganese-containing copper interconnect lead.

Example 23. The method of one of examples 21 or 22, further including: prior to depositing the graphene layer, etching away a portion of the first dielectric layer adjacent to the manganese containing copper interconnect lead to expose sidewalls of the manganese containing copper interconnect lead.

Example 24. The method of one of examples 21 to 23, further including removing a barrier layer from the sidewalls of the manganese containing copper interconnect lead.

Example 25. The method of one of examples 21 to 24, where the exposed surface is the top surface and the sidewall surfaces of the manganese containing copper interconnect lead.

Example 26. The method of example 23, further including forming the manganese containing copper interconnect lead by depositing a manganese containing copper seed layer on the first dielectric layer and on the surfaces of the damascene trenches, electroplating manganese containing copper to fill the damascene trenches, planarizing the surface of the manganese containing copper interconnect leads to be coplanar with the surface of the first dielectric layer, etching the first dielectric layer exposing the sidewalls of the manganese containing copper interconnect leads, and depositing a graphene barrier layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
   providing a substrate having a patterned film comprising manganese;
   depositing a graphene layer over exposed surfaces of the patterned film, wherein the graphene layer comprises a plurality of defects;
   depositing a dielectric layer containing silicon and oxygen over the graphene layer; and
   heat-treating the substrate to form a plurality of manganese-containing diffusion barrier regions between the graphene layer and the dielectric layer, wherein each of the plurality of manganese-containing diffusion barrier regions is formed at a respective one of the plurality of defects, and wherein the plurality of manganese-containing diffusion barrier regions are discontinuous regions.

2. The method of claim 1, wherein the plurality of manganese-containing diffusion barrier regions comprise manganese, silicon, and oxygen.

3. The method of claim 1, wherein the heat-treating includes heating the substrate to a temperature between 200° C. and 500° C.

4. The method of claim 1, further comprising performing a damascene process to form the patterned film in another dielectric layer below the dielectric layer, the patterned film forming a copper interconnect lead.

5. The method of claim 4, further comprising:
   prior to depositing the graphene layer, etching away a portion of the another dielectric layer adjacent to the patterned film to expose sidewall surfaces of the patterned film.

6. The method of claim 5, further comprising removing a barrier layer from the sidewall surfaces of the patterned film.

7. The method of claim 5, wherein the exposed surfaces are a top surface and the sidewall surfaces of the patterned film.

8. The method of claim 1, further comprising performing a dual damascene process to form the patterned film in another dielectric layer below the dielectric layer, the patterned film forming a copper interconnect lead.

9. The method of claim 1, wherein the patterned film comprises copper alloy doped with the manganese.

10. The method of claim 1, wherein the patterned film further comprises ruthenium, cobalt, tungsten, nickel, or iridium.

11. A method of forming a semiconductor device, the method comprising:
    providing a substrate containing a metallization layer and a first dielectric layer containing silicon and oxygen;
    depositing a barrier layer over the metallization layer and over the first dielectric layer;
    depositing a conductive film containing manganese over the barrier layer;
    heat-treating the substrate for a first time to form a first manganese-containing diffusion barrier region between the barrier layer and the first dielectric layer;
    patterning and etching the conductive film to form a patterned conductive film over the first manganese-containing diffusion barrier region;
    depositing a graphene layer over a sidewall surface and on a top surface of the patterned conductive film;
    depositing a second dielectric layer containing silicon and oxygen on the graphene layer; and
    heat-treating the substrate for a second time to form a second manganese-containing diffusion barrier region.

12. The method of claim 11, wherein the first and the second manganese-containing diffusion barrier regions comprise manganese, silicon, and oxygen.

13. The method of claim 11, wherein the heat-treating for the first and second times includes heating the substrate to a temperature between 200° C. and 500° C.

14. The method of claim 11, wherein the heat-treating for the first time dissolves the barrier layer between the metallization layer and the conductive film.

15. The method of claim 11, wherein the conductive film comprises copper and the barrier layer comprises manganese.

16. A method of forming a semiconductor device, the method comprising:
    providing a substrate having a patterned film comprising manganese;
    depositing a graphene layer over exposed surfaces of the patterned film, wherein the graphene layer comprises a plurality of defects;
    depositing a dielectric layer containing silicon and oxygen over the graphene layer; and
    heat-treating the substrate to form a plurality of stop plugs at the plurality of defects, wherein the plurality of stop plugs comprise manganese-containing material.

17. The method of claim 16, wherein the manganese-containing material comprises manganese, silicon, and oxygen.

18. The method of claim 16, wherein the heat-treating includes heating the substrate to a temperature between 200° C. and 500° C.

19. The method of claim 16, wherein the patterned film further comprises copper.

20. The method of claim 19, wherein the plurality of stop plugs blocks copper diffusion through the plurality of defects.

* * * * *